United States Patent

Mousseau et al.

(10) Patent No.: US 9,128,159 B2
(45) Date of Patent: Sep. 8, 2015

(54) PLUG-IN CHARGE CAPACITY ESTIMATION METHOD FOR LITHIUM IRON-PHOSPHATE BATTERIES

(71) Applicant: GM GLOBAL TECHNOLOGY OPERATIONS LLC, Detroit, MI (US)

(72) Inventors: Christopher W. Mousseau, Canton, MI (US); Michael Wahlstrom, Walled Lake, MI (US); Zachary D. Bylsma, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 355 days.

(21) Appl. No.: 13/712,778

(22) Filed: Dec. 12, 2012

(65) Prior Publication Data
US 2014/0163853 A1 Jun. 12, 2014

(51) Int. Cl.
*H02J 7/00* (2006.01)
*G01R 31/36* (2006.01)
*G06F 15/00* (2006.01)

(52) U.S. Cl.
CPC .......... *G01R 31/3606* (2013.01); *G01R 31/361* (2013.01); *G06F 15/00* (2013.01); *H02J 7/00* (2013.01)

(58) Field of Classification Search
CPC ..... H02J 7/00; G01R 31/3606; G01R 31/361; G06F 15/00
USPC .................................. 320/149, 152, 159, 164
See application file for complete search history.

(56) References Cited

U.S. PATENT DOCUMENTS

| | | | | |
|---|---|---|---|---|
| 4,396,880 | A * | 8/1983 | Windebank | 320/156 |
| 5,615,129 | A * | 3/1997 | Stich et al. | 700/297 |
| 6,621,250 | B1 * | 9/2003 | Ohkubo et al. | 320/136 |
| 6,661,231 | B1 * | 12/2003 | Arai et al. | 324/426 |
| 7,557,584 | B2 * | 7/2009 | Murakami et al. | 324/429 |
| 8,203,305 | B1 * | 6/2012 | Wortham et al. | 320/110 |
| 8,957,640 | B2 * | 2/2015 | Hirai et al. | 320/149 |
| 8,970,174 | B2 * | 3/2015 | Nakayama et al. | 320/134 |
| 2002/0145430 | A1 * | 10/2002 | Arai et al. | 324/426 |
| 2005/0154544 | A1 * | 7/2005 | Ono | 702/63 |
| 2006/0012340 | A1 * | 1/2006 | Saeki et al. | 320/132 |
| 2006/0220619 | A1 * | 10/2006 | Namba et al. | 320/149 |

(Continued)

OTHER PUBLICATIONS

Stevens, Matthew Burgess, "Hybrid Fuel Cell Vehicle Powertrain Development Considering Power Source Degradation" a Thesis for a Doctor of Philosophy in Chemical Engineering, Waterloo, Ontario, Canada, 2008, 228 pgs.

*Primary Examiner* — Phallaka Kik
(74) *Attorney, Agent, or Firm* — John A. Miller; Miller IP Group, PLC (57) ABSTRACT

A method for estimating charge capacity of a lithium iron-phosphate battery pack using data from a plug-in charge event. A laboratory-measured battery pack resistance, which is known to remain constant over a battery pack's life, can be used to determine open circuit voltage from terminal voltage during charging. Actual open circuit voltage after charging can be measured later, after the battery pack has rested for a sufficient amount of time. The two values of open circuit voltage, if taken at points on the battery pack's SOC-OCV curve which have great enough slope, provide two values of battery pack state of charge. By integrating charging current over the time interval between the two open circuit voltage readings, and using the two state of charge values, the battery pack capacity can be determined from the plug-in charge data.

19 Claims, 4 Drawing Sheets

(56) References Cited

U.S. PATENT DOCUMENTS

| | | | |
|---|---|---|---|
| 2006/0273761 A1* | 12/2006 | Arai et al. | 320/132 |
| 2008/0030169 A1* | 2/2008 | Kamishima et al. | 320/134 |
| 2008/0094031 A1* | 4/2008 | Singh et al. | 320/132 |
| 2009/0021218 A1* | 1/2009 | Kelty et al. | 320/137 |
| 2009/0055110 A1* | 2/2009 | Kelley et al. | 702/63 |
| 2010/0198536 A1* | 8/2010 | Hess | 702/63 |
| 2011/0109275 A1* | 5/2011 | Taniguchi | 320/145 |
| 2012/0065824 A1* | 3/2012 | Takahashi et al. | 701/22 |
| 2012/0109556 A1* | 5/2012 | Syed et al. | 702/63 |
| 2012/0274331 A1* | 11/2012 | Liu et al. | 324/426 |
| 2012/0290234 A1* | 11/2012 | Schaefer | 702/63 |
| 2012/0306450 A1* | 12/2012 | Nakayama et al. | 320/134 |
| 2013/0002194 A1* | 1/2013 | Sasaki et al. | 320/107 |
| 2013/0204561 A1* | 8/2013 | Daiss | 702/63 |
| 2013/0275067 A1* | 10/2013 | Mikuteit et al. | 702/63 |
| 2013/0317771 A1* | 11/2013 | Laskowsky et al. | 702/63 |
| 2014/0257726 A1* | 9/2014 | Baba et al. | 702/63 |
| 2014/0368031 A1* | 12/2014 | Schmidt | 307/10.7 |

* cited by examiner

PLUG-IN CHARGE CAPACITY ESTIMATION METHOD FOR LITHIUM IRON-PHOSPHATE BATTERIES

BACKGROUND OF THE INVENTION

1. Field of the Invention

This invention relates generally to determination of charge capacity of a battery pack and, more particularly, to a method for estimating the capacity of a lithium iron-phosphate battery pack after charging, where a property of lithium iron-phosphate battery resistance is used to enable determination of open circuit voltage during charging, and where characteristics of a voltage vs. state of charge curve for lithium iron-phosphate batteries are used to determine state of charge at two points on the voltage-charge curve, thus enabling actual charge capacity to be determined.

2. Discussion of the Related Art

Electric vehicles and gasoline-electric or diesel-electric hybrid vehicles are rapidly gaining popularity in today's automotive marketplace. Electric and hybrid-electric vehicles offer several desirable features, such as reducing or eliminating emissions and petroleum-based fuel consumption at the consumer level, and potentially lower operating costs. A key subsystem of electric and hybrid-electric vehicles is the battery pack, which can represent a substantial proportion of the vehicle's cost. Battery packs in these vehicles typically consist of numerous interconnected cells, which are able to deliver a lot of power on demand. Maximizing battery pack performance and life, and accurately informing the driver of the remaining vehicle range on battery power, are key considerations in the design and operation of electric and hybrid electric vehicles.

A typical electric vehicle battery pack includes two or more battery pack sections, with each section containing many individual battery cells as needed to provide the required voltage and capacity. In order to optimize the performance and durability of the battery pack, and to determine the amount of available charge capacity, it is important to monitor the state of charge of the battery pack. State of charge of a battery cell or a full battery pack is typically determined based on its open circuit voltage, using a known relationship which is defined in the form of a state of charge vs. open circuit voltage (SOC-OCV) curve. However, in some types of batteries, such as lithium iron-phosphate batteries, the extremely low slope characteristic of the SOC-OCV curve makes it very difficult to accurately determine state of charge based on open circuit voltage.

Furthermore, it is not feasible to simply measure charging and discharging current into and out of the lithium iron-phosphate battery pack in order to continuously determine state of charge, as small errors would accumulate over time to cause a large inaccuracy in such a measurement. Also, because a battery pack's capacity can fade over the life of the battery pack, an accurate understanding of driving range requires knowledge of both state of charge and battery pack capacity. A method is needed for accurately determining charge capacity of a lithium iron-phosphate battery pack, where the method does not suffer from the inaccuracies described above.

SUMMARY OF THE INVENTION

In accordance with the teachings of the present invention, a method is disclosed for estimating charge capacity of a lithium iron-phosphate battery pack using data from a plug-in charge event. A laboratory-measured battery pack resistance, which is known to remain constant over a battery pack's life, can be used to determine open circuit voltage from terminal voltage during charging. Actual open circuit voltage after charging can be measured later, after the battery pack has rested for a sufficient amount of time. The two values of open circuit voltage, if taken at points on the battery pack's SOC-OCV curve which have great enough slope, provide two values of battery pack state of charge. By integrating charging current over the time interval between the two open circuit voltage readings, and using the two state of charge values, the battery pack capacity can be determined from the plug-in charge data.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a method for estimating plug-in charge capacity of a lithium iron-phosphate battery pack is merely exemplary in nature, and is in no way intended to limit the invention or its applications or uses. For example, the discussion that follows is directed to battery packs used in electric vehicles, but the method is equally applicable to battery packs in other vehicular and non-vehicular applications.

Battery packs in electric vehicles and gasoline-electric or diesel-electric hybrid vehicles (hereinafter collectively referred to simply as "electric vehicles") typically consist of hundreds of individual cells. In many popular rechargeable battery chemistries, each cell produces about 3-4 volts nominally, with the exact value depending on which battery chemistry is used, state of charge and other factors. Many cells connected serially in a module provide the high voltage necessary to drive electric vehicle motors, while multiple cells can be arranged in parallel in cell groups to increase capacity.

In order for a driver to manage the driving range of an electric vehicle, it is important to know both the state of charge and the charge capacity of the battery pack at all times. Charge capacity is the actual amount of electrical energy stored in the battery pack and available for use by the vehicle.

Charge capacity is expressed in units of energy (such as kilowatt-hours, or kW-h), or in units of current-times-time (such as amp-hours, at a certain assumed voltage). State of charge is a number, expressed as a percentage, which indicates how much electrical energy is stored in a battery pack relative to the capacity of the battery pack. That is, a fully charged battery pack has a state of charge of 100%, while a fully discharged battery pack has a state of charge of 0%.

State of charge of a battery pack is typically determined based on the open circuit voltage of the battery pack, using a known relationship which is defined in the form of a state of charge vs. open circuit voltage (SOC-OCV) curve. Using this relationship, a battery controller in an electric vehicle can monitor the state of charge of the battery pack at all times. However, some battery chemistries have a characteristic SOC-OCV curve which has very little slope—that is, the open circuit voltage changes very little over a wide range of state of charge values—thus making it very difficult to accurately determine state of charge based on open circuit voltage.

Because energy storage capacity can fade as the battery pack ages, it is not sufficient to simply indicate to the driver that, for example, "state of charge=100%" after a full charge, because 100% state of charge for an old battery pack represents less energy than 100% state of charge for a new battery pack. Rather, it is necessary to determine the actual energy storage capacity of the battery pack at its current state of health, which, together with state of charge, provide a true indication of the vehicle's range available to the driver.

Figure 1:
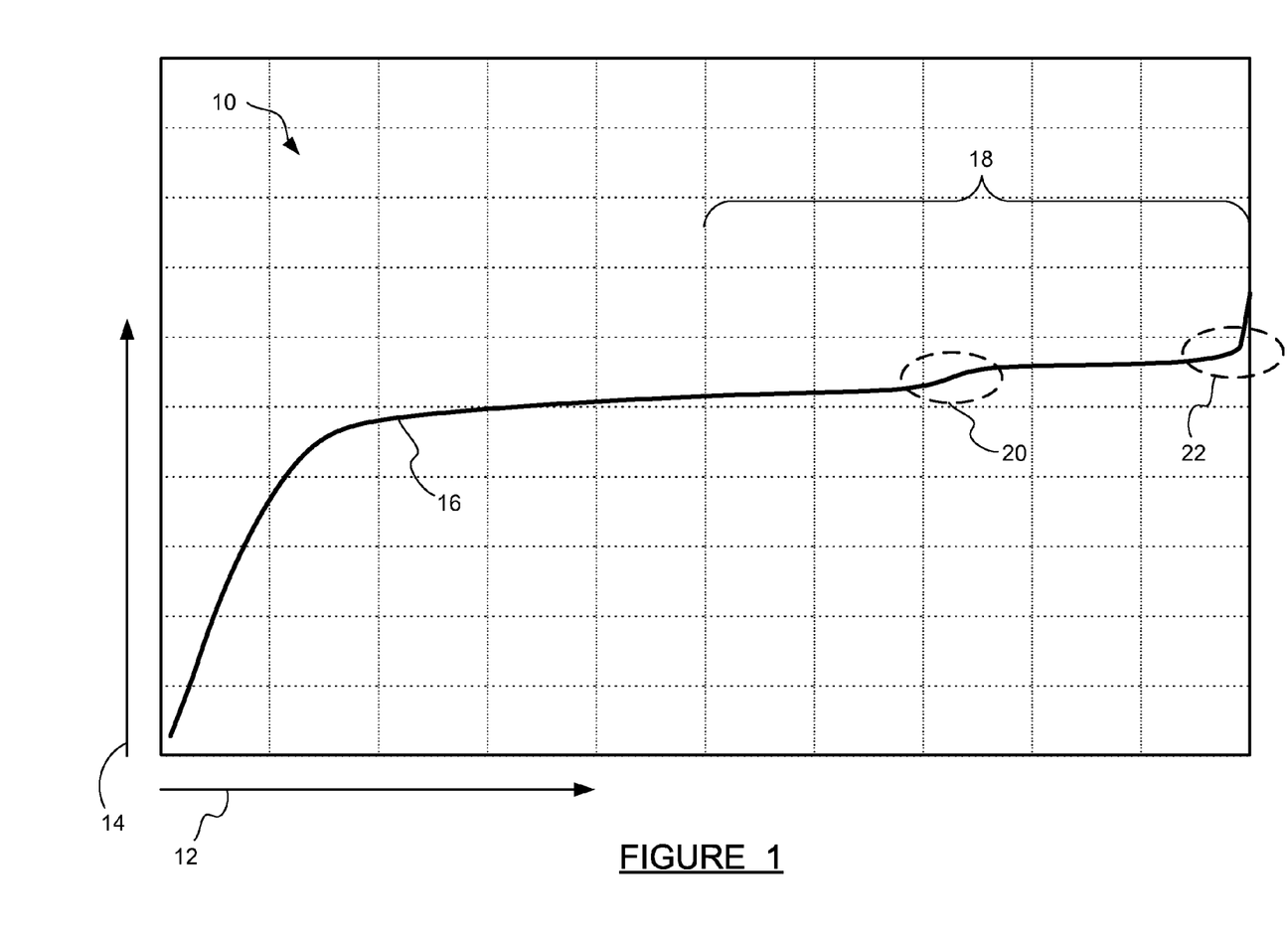
FIG. 1 is a graph showing a state of charge vs. open circuit voltage (SOC-OCV) curve for a lithium iron-phosphate battery pack.

FIG. 1 is a graph 10 showing an SOC-OCV curve for a lithium iron-phosphate battery cell. Lithium iron-phosphate is a battery chemistry used in battery packs for some new electric vehicles. On the graph 10, horizontal axis 12 represents state of charge of the battery cell, ranging from 0-100%. Vertical axis 14 represents open circuit voltage of the cell, with values ranging from about 3.0 volts to about 3.5 volts. Curve 16 depicts how the open circuit voltage varies with state of charge for the lithium iron-phosphate battery cell. Bracket 18 shows the typical usage window of an electric vehicle driver, reflecting the fact that most drivers drive their electric vehicle only half or less of the maximum range before recharging. Thus, the state of charge of the battery pack, and each individual cell, seldom drops below about 50%.

It can be seen that most of the SOC-OCV curve 16 has very little slope, especially in the 50-100% state of charge window indicated by the bracket 18. Due to the very small change in open circuit voltage across a wide range of state of charge values, it is virtually impossible to accurately determine state of charge by simply measuring an open circuit voltage value in a lithium iron-phosphate battery cell or battery pack. This is particularly true because most drivers rarely deplete the electric vehicle battery pack below 20%, where the high slope of the SOC-OCV curve 16 would allow an accurate state of charge determination from open circuit voltage. However, within the typical usage window indicated by the bracket 18, it can be seen that the slope of the curve 16 increases to a suitable value at two places, signified by ovals 20 and 22. This characteristic of the SOC-OCV curve 16 for a lithium iron-phosphate battery cell or battery pack can be used to enable accurate determination of state of charge and charge capacity, as will be discussed in detail below.

Reduced to first principles, the capacity of a battery pack can be determined by measuring the cumulative current (amp-hours) for a charging event and dividing it by the difference between the ending state of charge and the beginning state of charge. This principle is expressed in Equation (1) as follows:

$$\text{Capacity} = \left( \frac{IntAH}{SOC(V_{OC_{end}}) - SOC(V_{OC_{start}})} \right) \cdot \text{Ratio} \quad (1)$$

Where Capacity is the energy storage capacity of the battery pack in its current state of health, IntAH is the time integral of the charging current from the start point to the end point, $SOC(V_{OC_{end}})$ is the state of charge associated with the open circuit voltage at the end point, $SOC(V_{OC_{start}})$ is the state of charge associated with the open circuit voltage at the start point, and Ratio is a ratio which can be used as a calibration factor for temperature. IntAH is calculated as $IntAH = \int_{t_{start}}^{t_{end}} I \cdot dt$.

As discussed above, the very low slope characteristic of the SOC-OCV curve 16 for a lithium iron-phosphate battery pack makes it impractical to simply measure battery pack voltage at the start and end of a plug-in charge event and accurately determine state of charge, because at most points on the curve 16, a very small variation in open circuit voltage would result in a large error in the state of charge value. Furthermore, measured battery pack voltage (terminal voltage) is different from open circuit voltage, where the difference is a function of several factors. This further complicates the problem of battery pack state of charge and capacity determination. Thus, a new method is needed which overcomes both the difficulty of accurately determining open circuit voltage, and the difficulty of accurately determining state of charge based on open circuit voltage.

Figure 2:
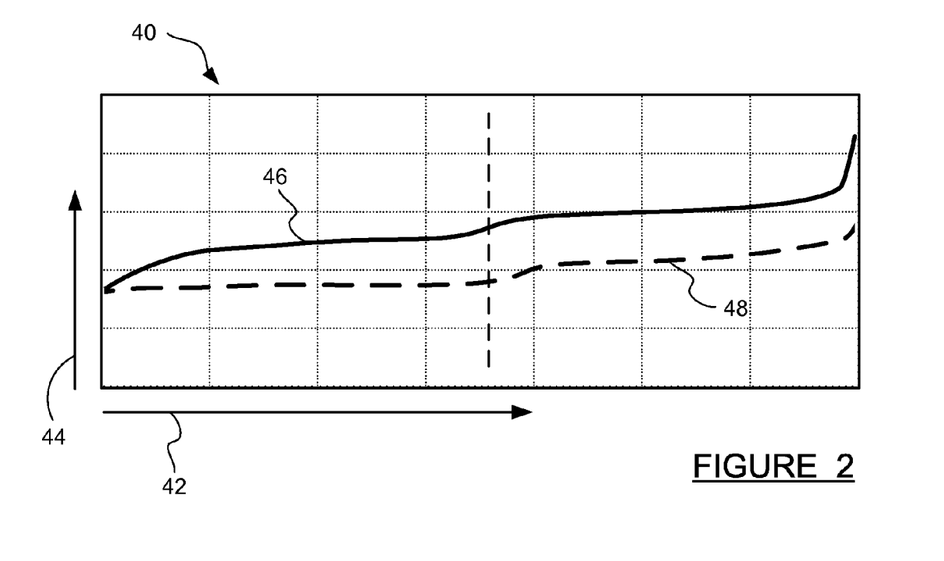
FIG. 2 is a graph showing terminal voltage and open circuit voltage as a function of time during a lithium iron-phosphate battery pack plug-in charge event.

FIG. 2 is a graph 40 showing terminal voltage and open circuit voltage as a function of time during a lithium iron-phosphate battery pack plug-in charge event. On the graph 40, horizontal axis 42 represents elapsed time during the charge event, which runs from zero to and end time measured in hours—typically 4-5 hours, but potentially more or less. Vertical axis 44 represents battery pack voltage, where the scale runs from about 350 volts to about 400 volts. Curve 46 is a plot of measured battery terminal voltage versus time. Starting at the left, where the charge event begins, the curve 46 exhibits an initial high slope, as the terminal voltage increases from the resting open circuit voltage of the battery pack to a value closer to the potential of the charging source. The curve 46 then traces a shape very similar to the curve 16 of FIG. 1, where a region of very low slope is followed by a slight upward jog, then another region of very low slope, and finally a sharp upward slope as the battery pack nears full charge.

Curve 48 is a plot of battery pack open circuit voltage versus time during the charge event. Open circuit voltage cannot be measured during charging, because of the charging voltage and current. At a given point in time, the open circuit voltage is the voltage that the battery pack would exhibit if charging were stopped and the battery pack were allowed to rest with no load for some time—typically an hour or more. The curve 48 starts at essentially the same value as the terminal voltage of the curve 46, but does not exhibit the initial rapid increase. Rather, the curve 48 traces the characteristic shape of a lithium iron-phosphate battery pack charging curve, as discussed previously.

Figure 3:
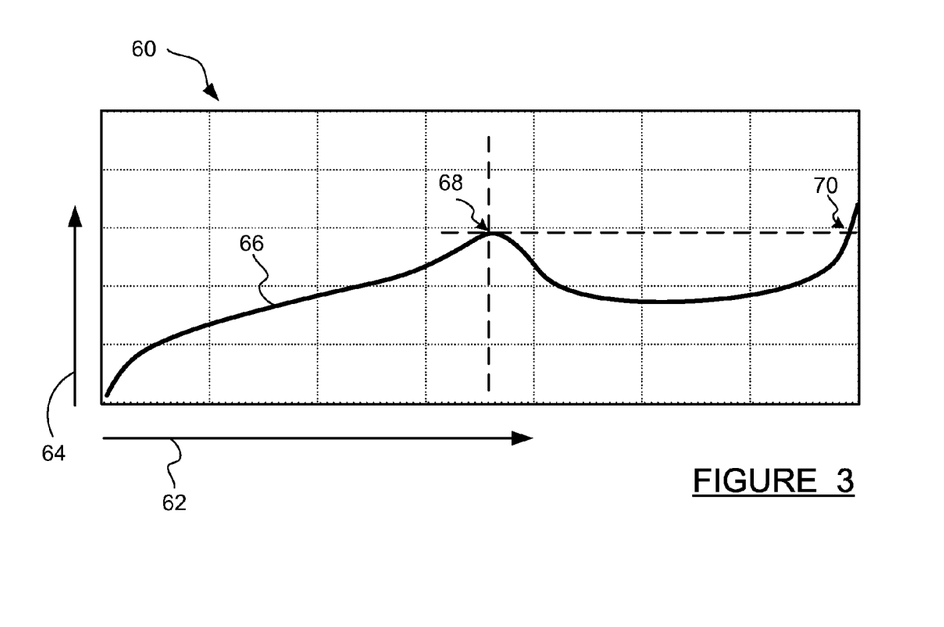
FIG. 3 is a graph showing the difference between the terminal voltage and the open circuit voltage curves of FIG. 2.

FIG. 3 is a graph 60 showing the difference between the terminal voltage curve 46 and the open circuit voltage curve 48 of FIG. 2. It will be shown how a value from the graph 60 can be used with a known battery pack resistance to determine open circuit voltage during charging. On the graph 60, horizontal axis 62 represents time, the same as the horizontal axis 42 on the graph 40. Vertical axis 64 represents voltage, with a scale running from zero to about 10 volts. Curve 66 plots the difference between the terminal voltage on the curve 46 and the open circuit voltage on the curve 48. It can be seen that the curve 66 starts at zero, increases to a well-defined local maximum about midway through the charge event, drops off significantly, levels off, and then increases sharply again at the end of the charge event.

In order to estimate open circuit voltage during charging, it is necessary to understand the relationship between terminal voltage and open circuit voltage as shown in FIGS. 2 and 3. This relationship can be expressed as follows:

$$V_{oc} = V_t - I \cdot R_O \cdot k \quad (2)$$

Where $V_{oc}$ is the open circuit voltage of the battery pack, $V_t$ is the terminal voltage of the battery pack, I is the charging current, $R_O$ is the battery pack resistance, and k is a calibration constant.

In previous methods for estimating open circuit voltage from terminal voltage, the resistance $R_O$ was estimated via regression calculations from many observations of open circuit voltage and terminal voltage. However, the regression calculations can be avoided by using the assumption that "overpotential", or the I·R term of Equation (2), does not change over the life of a lithium iron-phosphate battery, when the battery is used in a low charge-rate application. The constant overpotential assumption is documented by M. Stevens, in a 2008 Doctoral dissertation titled, "*Hybrid Fuel Cell Vehicle Powertrain Development Considering Power Source Degradation*", University of Waterloo, Waterloo, Canada. The plug-in charge rates experienced by a lithium iron-phosphate battery pack in an electric vehicle are well within the range documented by Stevens as meeting the assumption criteria.

Using the constant overpotential assumption, Equation (2) can be rewritten as:

$$V_{oc} = V_t - I \cdot R \quad (3)$$

Where R is the battery pack resistance which can be measured from testing and subsequently used in Equation (3) to determine open circuit voltage.

Referring again to FIG. 3, it is noted that the curve 66 is the difference between terminal voltage and open circuit voltage—that is, the curve 66 represents the I·R term of Equation (3). The objective, in order to determine battery pack capacity from data measured during a plug-in charge event, is to be able to calculate open circuit voltage from terminal voltage. This is possible if the resistance R is determined ahead of time, through laboratory testing.

Figure 4:
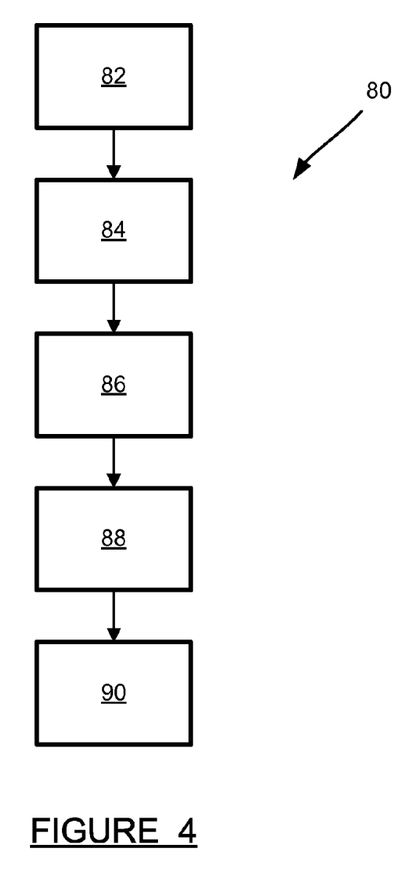
FIG. 4 is a flowchart diagram of a method for determining a resistance of a lithium iron-phosphate battery pack.

FIG. 4 is a flowchart diagram 80 of a method for determining a resistance of a lithium iron-phosphate battery pack. At box 82, data are recorded for a plug-in charge event in a laboratory environment. The recorded data include terminal voltage of the battery pack and charging current, both as a function of time. At box 84, the state of charge of the battery pack is determined, and the state of charge is correlated to an open circuit voltage, for the duration of the charge event. The state of charge determination can be made using data from many charging events, and the SOC-OCV correlation is known, as discussed previously. The steps of the box 84 result in the curves 46 and 48 of FIG. 2.

At box 86, the difference between the terminal voltage and open circuit voltage curves is calculated. This difference is shown by the curve 66 of FIG. 3, and represents the I·R term of Equation (3). At box 88, the value of R can be solved for at a desired location on the curve 66, by dividing the I·R term by the known charging current I at that time. The value of R will be calculated at the point 68 on the curve 66, because the point 68 occurs at a time in the charge event when the terminal voltage curve 46 takes on an appreciable slope and thus, the terminal voltage can measured with sufficient accuracy. At box 90, the steps of the boxes 82-88 are repeated for the range of temperatures and charge currents expected to be seen in real customer vehicle usage.

With the value of R known for a given terminal voltage, as described above, it is then possible to determine open circuit voltage, and hence state of charge, at a point during a plug-in charge event performed by a customer on a vehicle in service. By identifying a point 70 on the curve 66 where the value of I·R is the same as at the point 68, it is possible to determine open circuit voltage, and hence state of charge, at a second point during a plug-in charge event. Using the state of charge at the two points 68 and 70, it is possible to determine the total capacity of the battery pack using Equation (1) as defined previously.

In many cases, a customer charges his/her electric vehicle overnight, and the charge event completes several hours before the vehicle is again driven. In these cases, it is possible to actually measure open circuit voltage of the battery pack at the moment when the vehicle "wakes up" to be driven again. At that time, if a sufficient amount of time has passed since the charge completed so that the battery pack has settled to a steady state condition, and before any new load is applied to the battery pack, the open circuit voltage will be equal to the measured terminal voltage. Using this measured value of open circuit voltage, designated as OCV, Equation (1) can be rewritten as:

$$\text{Capacity} = \left( \frac{IntAH}{SOC(OCV_{end}) - SOC(V_{OC_{start}})} \right) \cdot \text{Ratio} \quad (4)$$

Where Capacity is the energy capacity of the battery pack in its current state of health, IntAH is the time integral of the charging current from the start point to the end point, $SOC(OCV_{end})$ is the state of charge associated with the open circuit voltage at the end point (measured as terminal voltage after the battery pack is allowed to rest), $SOC(V_{OC_{start}})$ is the state of charge associated with the open circuit voltage at the start point (the point 68 of the plug-in charge, where open circuit voltage can be determined by knowing R), and Ratio is the calibration factor for temperature.

Using the measured value of open circuit voltage after a charge event and a rest period, as in Equation (4), has been shown to improve the accuracy of the estimated battery pack capacity. This is because the end-state open circuit voltage, $OCV_{end}$, is known to be measurably accurate, and estimation of the battery pack resistance R is no longer involved in the end-state open circuit voltage.

In situations where the vehicle is driven and the lithium iron-phosphate battery pack is not immediately recharged, a terminal voltage measurement can be taken when the vehicle is subsequently woken up. If enough time has elapsed to allow the battery pack to reach steady state, the measured terminal voltage can likewise be equated to open circuit voltage. If the measured open circuit voltage on vehicle wake-up happens to fall at or near the point 68, where the terminal voltage curve 46 has an appreciable slope, then this measured open circuit voltage, OCV, can be used to determine the starting state of charge in Equation (4).

Figure 5:
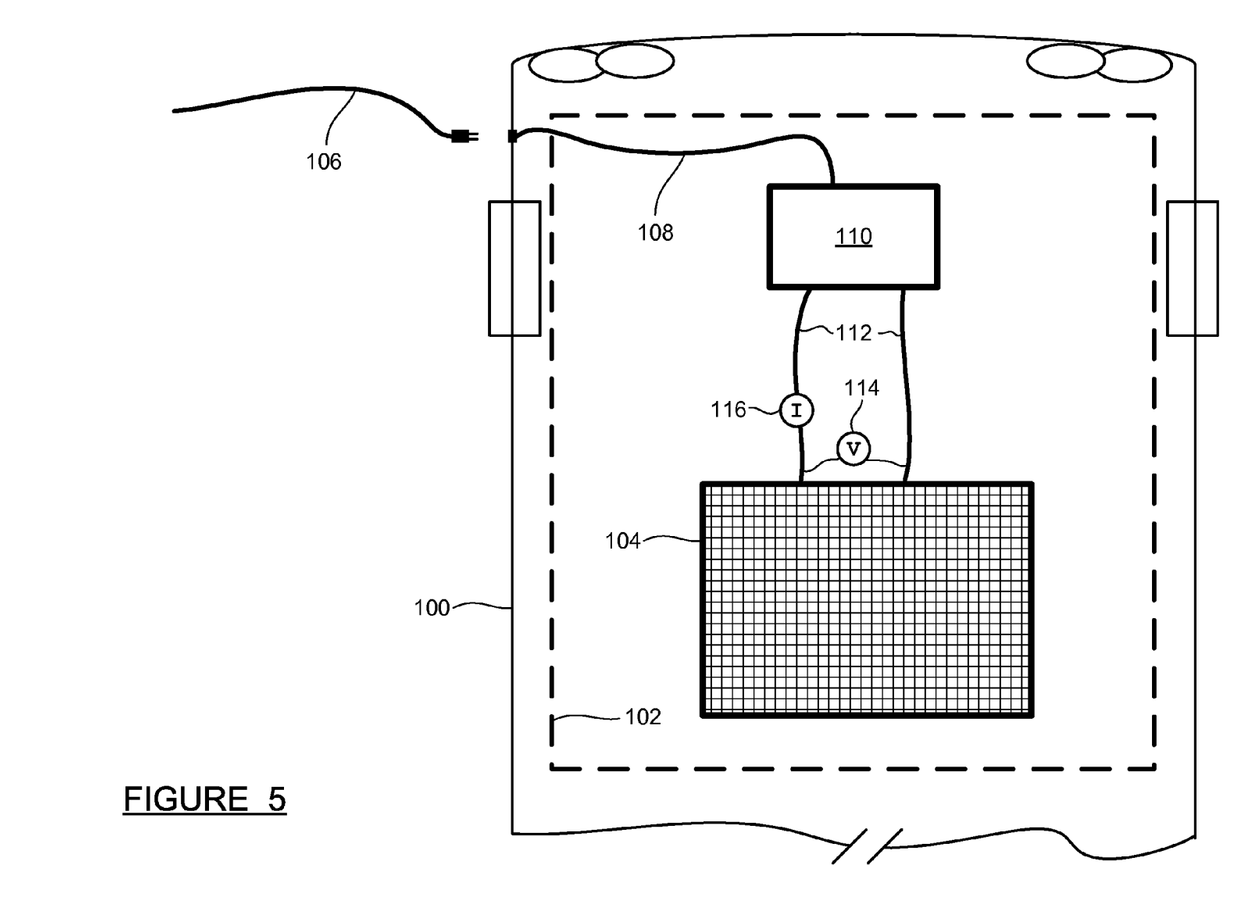
FIG. 5 is a block diagram of a system for estimating the capacity of a lithium iron-phosphate battery pack after a plug-in charge event.

FIG. 5 is a block diagram of a vehicle 100 including a system 102 for estimating the capacity of a lithium iron-phosphate battery pack 104, using data from a plug-in charge event. FIG. 5 depicts the physical embodiment of the methods described previously herein. The vehicle 100 is an electric vehicle or hybrid-electric vehicle which allows plug-in charging of the battery pack 104 via a power cord 106 which is typically connected to the utility power grid. An internal cable 108 routes the charging current to a controller 110, which controls the plug-in charge event and determines battery pack capacity. Positive and negative leads 112 carry the charging current to the battery pack 104, as controlled by the controller 110. The leads 112 may also be used to provide battery pack power to one or more drive motors (not shown), which power the vehicle 100.

A voltmeter 114, in communication with the controller 110, measures terminal voltage across the battery pack 104. A current sensor, or ammeter 116, also in communication with the controller 110, measures charging current during the plug-in charge event. The controller 110 is configured to monitor charging current and terminal voltage during plug-in charge events, and subsequently determine the storage capacity of the battery pack 104, as discussed in detail previously.

Figure 6:
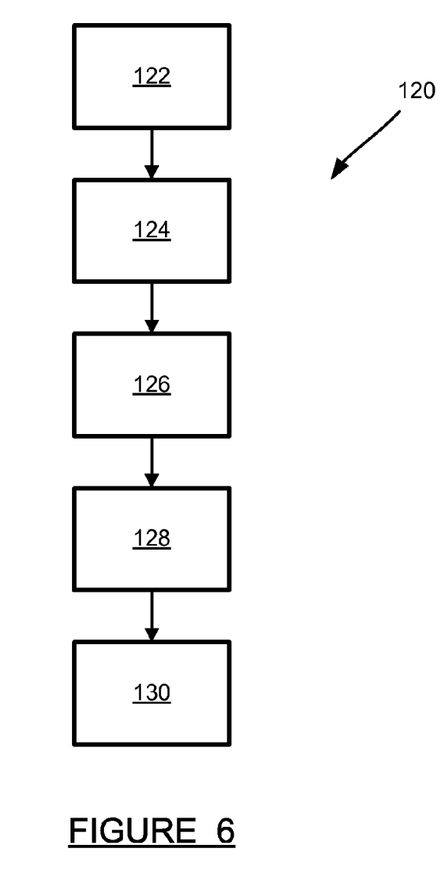
FIG. 6 is a flowchart diagram of a method for estimating the capacity of a lithium iron-phosphate battery pack using data from a plug-in charge event.

FIG. 6 is a flowchart diagram 120 of a method for estimating the capacity of a lithium iron-phosphate battery pack after a plug-in charge event. The method of the flowchart diagram 120 is to be used in customer vehicles, such as the vehicle 100, to estimate battery pack capacity after each charge event, and thus continuously track capacity throughout the life of the battery pack. At box 122, a plug-in charge of the battery pack 104 is started, and terminal voltage and charging current data are collected for the duration of the charge event. At box 124, the plug-in charge event is completed, and the current and voltage data are stored. At box 126, open circuit voltage values are determined from the terminal voltage data at two points in time of the charge event. The open circuit voltage values at the two points can be determined either by using Equation (3) and the known value of R to calculate open circuit voltage from terminal voltage, or by equating open circuit voltage to measured terminal voltage after the battery pack 104 has rested and reached a steady state condition.

At box 128, state of charge is determined at the two points in time, based on the open circuit voltage values and a known SOC-OCV curve. At box 130, battery pack capacity is calculated by integrating the current between the two points in time, and dividing the time-integrated current by the difference in state of charge at the two points in time, as defined in Equation (4).

Using the methods disclosed herein, the actual capacity of a lithium iron-phosphate battery pack in an electric vehicle can be monitored as the battery pack experiences repeated charge-discharge cycles. Accurate understanding of battery pack capacity, along with state of charge information, allows a vehicle driver to confidently drive the vehicle without worrying about running out of battery power. In addition, accurate understanding of battery pack capacity and state of charge help prevent over-charging and over-discharging of the battery pack, thus resulting in longer battery pack life and fewer warranty claims.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for estimating a charge capacity of a lithium iron-phosphate battery pack using data from a plug-in charge event, said method comprising:
    initiating the plug-in charge event of the battery pack, recording terminal voltage data during the charge event using a voltmeter, and recording charging current data during the charge event using a current sensor;
    completing the plug-in charge event and storing the terminal voltage data and the charging current data;
    determining open circuit voltage values from the terminal voltage data at two points in time from the plug-in charge event, including, for at least one of the two points in time, calculating the open circuit voltage by taking the terminal voltage at the point in time and subtracting the charging current at the point in time multiplied by a predetermined battery pack resistance;
    determining state of charge values from the open circuit voltage values at the two points in time from the plug-in charge event;
    calculating, using a controller including a processor, the charge capacity of the battery pack using the state of charge values and the charging current data; and
    communicating the charge capacity of the battery pack, by the controller, to a user of the battery pack.

2. The method of claim 1 wherein the predetermined battery pack resistance is determined by a method comprising:
    performing a laboratory-based plug-in charge event on the battery pack and recording terminal voltage data and charging current data during the laboratory-based plug-in charge event;
    determining state of charge of the battery pack from the terminal voltage data and the charging current data for the duration of the laboratory-based plug-in charge event;
    determining open circuit voltage data from the state of charge of the battery pack for the duration of the laboratory-based plug-in charge event;
    calculating overpotential values, for the duration of the laboratory-based plug-in charge event, as the difference between the terminal voltage data and the open circuit voltage data;
    calculating the predetermined battery pack resistance for at least one point in time of the laboratory-based plug-in charge event, where the resistance is equal to the overpotential value for the point in time divided by the charging current for the point in time; and
    repeating the laboratory-based plug-in charge event for a range of temperatures and charging currents.

3. The method of claim 1 wherein determining open circuit voltage values from the terminal voltage data at two points in time includes, for at least one of the two points in time, equating the open circuit voltage value to a measured terminal voltage after the battery pack has rested for a predetermined time period.

4. The method of claim 1 wherein determining state of charge values from the open circuit voltage values includes using a predetermined state of charge vs. open circuit voltage curve for the lithium iron-phosphate battery pack.

5. The method of claim 4 wherein the two points in time correspond to locations on the state of charge vs. open circuit voltage curve where the curve has a slope greater than a predetermined threshold value.

6. The method of claim 1 wherein calculating the charge capacity of the battery pack using the state of charge values and the charging current data includes using the equation:

$$\text{Capacity} = \left( \frac{IntAH}{SOC(V_{OC_{end}}) - SOC(V_{OC_{start}})} \right) \cdot \text{Ratio}$$

Where Capacity is the charge capacity of the battery pack, IntAH is a time integral of the charging current between the two points in time, $SOC(V_{OC_{end}})$ is the state of charge associated with the open circuit voltage at the second point in time, $SOC(V_{OC_{start}})$ is the state of charge associated with the open circuit voltage at the first point in time, and Ratio is a calibration factor for temperature.

7. The method of claim 1 wherein the lithium iron-phosphate battery pack is used in an electric vehicle.

8. The method of claim 7 further comprising using the charge capacity and the state of charge values to provide estimated driving range values to a driver.

9. A method for estimating driving range of an electric vehicle with a lithium iron-phosphate battery pack using data from a plug-in charge event, said method comprising:
   initiating the plug-in charge event of the battery pack, recording terminal voltage data during the charge event using a voltmeter, and recording charging current data during the charge event using a current sensor;
   completing the plug-in charge event and storing the terminal voltage data and the charging current data;
   determining open circuit voltage values from the terminal voltage data at two points in time from the plug-in charge event, where the two points in time correspond to locations on a state of charge vs. open circuit voltage curve for the lithium iron-phosphate battery pack where the curve has a slope greater than a predetermined threshold value;
   determining state of charge values from the open circuit voltage values at the two points in time from the plug-in charge event using the state of charge vs. open circuit voltage curve;
   calculating, using a controller including a processor, battery pack capacity using the state of charge values and the charging current data; and
   using the battery pack capacity and the state of charge values, by the controller, to provide estimated driving range values to a driver.

10. The method of claim 9 wherein determining open circuit voltage values from the terminal voltage data at two points in time includes, for at least one of the two points in time, calculating the open circuit voltage by taking the terminal voltage at the point in time and subtracting the charging current at the point in time multiplied by a predetermined battery pack resistance.

11. The method of claim 9 wherein determining open circuit voltage values from the terminal voltage data at two points in time includes, for at least one of the two points in time, equating the open circuit voltage value to a measured terminal voltage after the battery pack has rested for a predetermined time period.

12. The method of claim 9 wherein calculating battery pack capacity using the state of charge values and the charging current data includes using the equation:

$$Capacity = \left(\frac{IntAH}{SOC(V_{OC_{end}}) - SOC(V_{OC_{start}})}\right) \cdot Ratio$$

Where Capacity is the battery pack capacity, IntAH is a time integral of the charging current between the two points in time, $SOC(V_{OC_{end}})$ is the state of charge associated with the open circuit voltage at the second point in time, $SOC(V_{OC_{start}})$ is the state of charge associated with the open circuit voltage at the first point in time, and Ratio is a calibration factor for temperature.

13. A system for estimating a charge capacity of a lithium iron-phosphate battery pack using data from a plug-in charge event, said system comprising:
   a voltmeter for recording battery pack terminal voltage data before, during and after the charge event;
   an ammeter for recording battery pack charging current data during the charge event; and
   a controller in communication with the voltmeter and the ammeter, said controller being configured to control the charging current to the battery pack, said controller also being configured to estimate the charge capacity of the battery pack based on state of charge values for the battery pack at two points in time of the charge event and cumulative charging current between the two points in time.

14. The system of claim 13 wherein the state of charge values are determined from open circuit voltage values at the two points in time using a predetermined state of charge vs. open circuit voltage curve for the lithium iron-phosphate battery pack.

15. The system of claim 14 wherein the two points in time correspond to locations on the state of charge vs. open circuit voltage curve where the curve has a slope greater than a predetermined threshold value.

16. The system of claim 14 wherein the open circuit voltage value for at least one of the two points in time is calculated by taking the terminal voltage at the point in time and subtracting the charging current at the point in time multiplied by a predetermined battery pack resistance.

17. The system of claim 14 wherein the open circuit voltage value for at least one of the two points in time is determined by equating the open circuit voltage value to a measured terminal voltage after the battery pack has rested for a predetermined time period.

18. The system of claim 14 wherein the charge capacity of the battery pack is calculated using the equation:

$$Capacity = \left(\frac{IntAH}{SOC(V_{OC_{end}}) - SOC(V_{OC_{start}})}\right) \cdot Ratio$$

Where Capacity is the charge capacity of the battery pack, IntAH is a time integral of the charging current between the two points in time, $SOC(V_{OC_{end}})$ is the state of charge associated with the open circuit voltage at the second point in time, $SOC(V_{OC_{start}})$ is the state of charge associated with the open circuit voltage at the first point in time, and Ratio is a calibration factor for temperature.

19. The system of claim 13 wherein the lithium iron-phosphate battery pack is used in an electric vehicle, and the charge capacity of the battery pack and the state of charge values are used to provide estimated driving range values to a driver.

* * * * *